(12) United States Patent
Jackson et al.

(10) Patent No.: US 6,975,687 B2
(45) Date of Patent: Dec. 13, 2005

(54) LINEARIZED OFFSET QPSK MODULATION UTILIZING A SIGMA-DELTA BASED FREQUENCY MODULATOR

(75) Inventors: Thomas Jackson, Frederick, MD (US); George Eapen, Germantown, MD (US); Fa Dai, Germantown, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 915 days.

(21) Appl. No.: 09/883,539

(22) Filed: Jun. 18, 2001

(65) Prior Publication Data

US 2002/0067773 A1    Jun. 6, 2002

Related U.S. Application Data

(60) Provisional application No. 60/212,201, filed on Jun. 16, 2000.

(51) Int. Cl.$^7$ .............................. H04K 1/02; H03C 1/52; H04L 27/04
(52) U.S. Cl. ...................... 375/297; 375/296; 375/300; 375/302
(58) Field of Search ............................... 375/295, 302, 375/308, 298, 297, 296, 300, 146

(56) References Cited

U.S. PATENT DOCUMENTS

| | | | | |
|---|---|---|---|---|
| 4,965,531 A | * | 10/1990 | Riley | 331/1 A |
| 4,972,440 A | * | 11/1990 | Ernst et al. | 375/296 |
| 5,351,016 A | * | 9/1994 | Dent | 332/103 |
| 5,705,959 A | * | 1/1998 | O'Loughlin | 332/151 |
| 5,787,135 A | * | 7/1998 | Clark | 375/376 |
| 6,194,963 B1 | | 2/2001 | Camp, Jr. et al. | |
| 6,377,784 B2 | * | 4/2002 | McCune | 455/108 |
| 6,489,846 B2 | * | 12/2002 | Hatsugai | 330/149 |
| 6,590,940 B1 | * | 7/2003 | Camp et al. | 375/297 |

FOREIGN PATENT DOCUMENTS

| | | |
|---|---|---|
| EP | 0 998 088 A2 | 5/2000 |
| EP | 1 235 403 A2 | 8/2002 |
| WO | WO 01/22674 A1 | 3/2001 |

\* cited by examiner

OTHER PUBLICATIONS

Michael H. Perrott, Student Member, IEEE, Theodore L. Tewksbury III, Member, IEEE, and Charles G. Sodini, Fellow, IEEE, "A 27-mW CMOS Fractional-N Synthesizer Using Digital Compensation for 2.5-Mb/s GFSK Modulation", IEEE Journal of Solid-State Circuits, vol. 32, No. 12, Dec. 1997.

*Primary Examiner*—Chieh M. Fan
*Assistant Examiner*—Jason M. Perilla
(74) *Attorney, Agent, or Firm*—Craig Plastrik

(57) ABSTRACT

A vector modulator including an offset QPSK modulator operative for receiving input data and generating a first output signal representing the modulation to be imposed on a carrier signal to effect offset QPSK modulation of the input signal and a second output signal representing an amplitude of the input data; and a frequency modulator including a sigma-delta modulator, operative for receiving the first output signal generated by the offset QPSK modulator, and generating a control signal representing the desired frequency of the carrier signal such that the carrier signal represents the input signal offset QPSK modulated. The vector modulator also includes a phase-lock loop circuit having a voltage controlled oscillator for generating the carrier signal and a programmable frequency divider for receiving the control signal as an input signal and for changing the frequency of the carrier signal in accordance with the control signal, and an amplifier having a variable gain which is operative for receiving and amplifying the carrier signal output by the phase-lock loop circuit in accordance with the amplitude of the second output signal.

19 Claims, 3 Drawing Sheets

LINEARIZED OFFSET QPSK MODULATION UTILIZING A SIGMA-DELTA BASED FREQUENCY MODULATOR

RELATED APPLICATIONS

This application claims priority under 35 U.S.C. §119(e) to provisional application Ser. No. 60/212,201 filed Jun. 16, 2000.

FIELD OF THE INVENTION

The present invention relates to modulators for implementing vector modulation, and more particularly, to a cost efficient modulator that provides for linearized constant-envelope offset QPSK modulation utilizing a sigma-delta based fractional-N synthesizer.

BACKGROUND OF THE INVENTION

Vector modulators utilizing frequency synthesizers are well known in the art, and are utilized in various applications. In conventional modulators, the baseband signal is converted to an analog signal by means of a digital-to-analog converter and is then mixed with a synthesized carrier by means including the use of an image rejection mixer. The use of sigma delta based fractional-N synthesizers in such modulator designs is becoming more common.

A typical prior art fractional N synthesizer is illustrated in FIG. 1. Referring to FIG. 1, the synthesizer comprises a reference frequency generator 10 (e.g. a crystal oscillator) for generating a reference frequency, Fo. The reference frequency generator 10 is coupled to a frequency divider circuit 12 so as to allow the frequency signal Fo to be divided down by a factor of R to a desired value. The output of the frequency divider 12 is then coupled to a phase-lock loop circuit 14 comprising a phase-detector 16, a filter 15, a voltage controlled oscillator 18 (VCO) and a variable divider circuit 20.

The synthesizer further includes a fractional control circuit 21 or interpolator coupled to the variable divider circuit 20. In operation, the fractional control circuit 21 controls the variable divider circuit 20 such that the divider alternately divides the VCO output 18 by a factor of N, or a factor of N+1. By controlling the rate by which the VCO output is divided by N or N+1, it is possible to generate an output signal, whose average value is a desired faction of N. Typically, the fractional control circuit 21 comprises an accumulator having a predetermined/programmable modulo (i.e., capacity) and bit length, which is determined in accordance with the desired fractional output. In response to each pulse output by the variable divider circuit 20, the accumulator is incremented, and when the accumulator overflows, it generates a carry signal. The carry signal is coupled to the variable divider circuit 20 and utilized to determine whether or not the variable divider circuit 21 should divide by a factor of N or N+1. An example of the operation of the accumulator is illustrative. Assuming it is desired to generate a frequency output equal to (N+0.25)Fo/R, the accumulator is programmed so as to generate a carry bit every fourth pulse. As such, the variable divider circuit 21 will operate to divide by N for 3 pulses and divide by N+1 every fourth pulse. As a result, output frequency of the synthesizer equals (N+0.25)Fo/R.

Notwithstanding the ability of known frequency synthesizers to generate output signals having a fractional value of "N", in order to obtain exceedingly fine resolution, prior art synthesizers still require the use of direct digital synthesizers to provide for exceedingly fine tuning/resolution. However, as direct digital synthesizers are expensive and generate unwanted spurious/noise signals, it is desirable to eliminate the need for the direct digital synthesizer from the design. In addition, it is desirable to provide for direct modulation of the carrier of the frequency synthesizer so as to allow for the elimination of digital-to-analog converters, image rejection mixers and RF filters from the design, all of which are required with conventional modulation schemes. The elimination of the foregoing components results in a significant cost savings.

Accordingly, there exists the need for a vector modulator that eliminates all of the foregoing problems.

SUMMARY OF THE INVENTION

The present invention relates to a linearized OQPSK modulator which comprises a fractional N synthesizer that provides for exceedingly fine tuning capabilities/resolution and that eliminates the need for utilization of a direct digital synthesizer. The OQPSK modulator provides for direct digital modulation of the carrier signal, thereby eliminating the need for digital-to-analog converters, image rejection mixers and RF filters from the modulator section of the synthesizer design. In addition, the OQPSK modulator also allows filtered baseband data to be utilized to control the power level of an output power amplifier, so as to allow amplitude information to be included in the output signal, even though substantially all of the modulator components are operating in a saturated mode of operation.

More specifically, the present invention relates to a vector modulator including an offset QPSK modulator operative for receiving input data and generating a first output signal representing the modulation to be imposed on a carrier signal to effect offset QPSK modulation of the input signal, and a second output signal representing the amplitude of the input data; and a frequency modulator including a sigma-delta modulator operative for receiving the first output signal generated by the offset QPSK modulator, and for generating a control signal representing the desired frequency of the carrier signal such that the carrier signal represents the input signal offset QPSK modulated. The vector modulator also includes a phase-lock loop circuit having a voltage controlled oscillator for generating the carrier signal and a programmable frequency divider for receiving the control signal as an input signal and for changing the frequency of the carrier signal in accordance with the control signal, and an amplifier having a variable gain which is operative for receiving and amplifying the carrier signal output by the phase-lock loop circuit in accordance with the amplitude of the second output signal.

The present invention also relates to a method for generating an offset QPSK modulated signal at a desired carrier frequency. The method comprises the steps of receiving an input data signal to be modulated; generating a first digital output signal representing the modulation to be imposed on the carrier signal to effect offset QPSK modulation of the digital input signal, and generating a second digital output signal representing the amplitude of the input data signal; utilizing a frequency modulator comprising a sigma-delta modulator to receive the digital output signal and to generate a digital control signal representing the desired frequency of the carrier signal such that the carrier signal represents the input data signal offset QPSK modulated; controlling a programmable frequency divider forming a portion of a phase-lock loop circuit in accordance with the digital control signal such that the programmable frequency divider operates to change the frequency of the carrier signal in accordance with the control signal; and varying the amplitude of the carrier signal in accordance with the amplitude of the input data signal.

As described below, the vector modulator of the present invention provides important advantages over prior art devices. For example, by eliminating the direct digital synthesizer from the design, the present invention eliminates the spurious/noise problems associated with the device, while simultaneously reducing the cost of the synthesizer. In addition, by providing for the direct modulation of the carrier, the synthesizer of the present invention also eliminates the need for digital-to-analog converters, image rejection mixers and RF filters from the modulator section of the design, thereby simplifying the design and providing a further cost savings.

In addition to the foregoing, the vector modulator of the present invention provides exceedingly high tuning/resolution capabilities at high frequencies, without any associated noise problems.

Furthermore, as amplitude information concerning the input signal is removed prior to the generation of the frequency modulated carrier signal such that the components of the sigma delta modulator can operate in a "saturated" mode, and amplitude information is then "put back" onto the frequency modulated carrier signal just prior to transmission of the signal by the power amplifier, the present invention is able to achieve linearized OQPSK modulation in an efficient, cost effective manner.

Additional advantages of the present invention will become apparent to those skilled in the art from the following detailed description of exemplary embodiments of the present invention.

The invention itself, together with further objects and attendant advantages, will best be understood by reference to the following detailed description, taken in conjunction with the accompanying drawings.

DETAILED DESCRIPTION OF THE DRAWINGS

The following detailed description of the linearized OQPSK modulator of the present invention sets forth an exemplary embodiment of the device. It is noted, however, that the present invention as claimed herein is not intended to be limited to the specific embodiment disclosed in the following discussion. Clearly other implementations of the novel modulator are possible.

Figure 2:
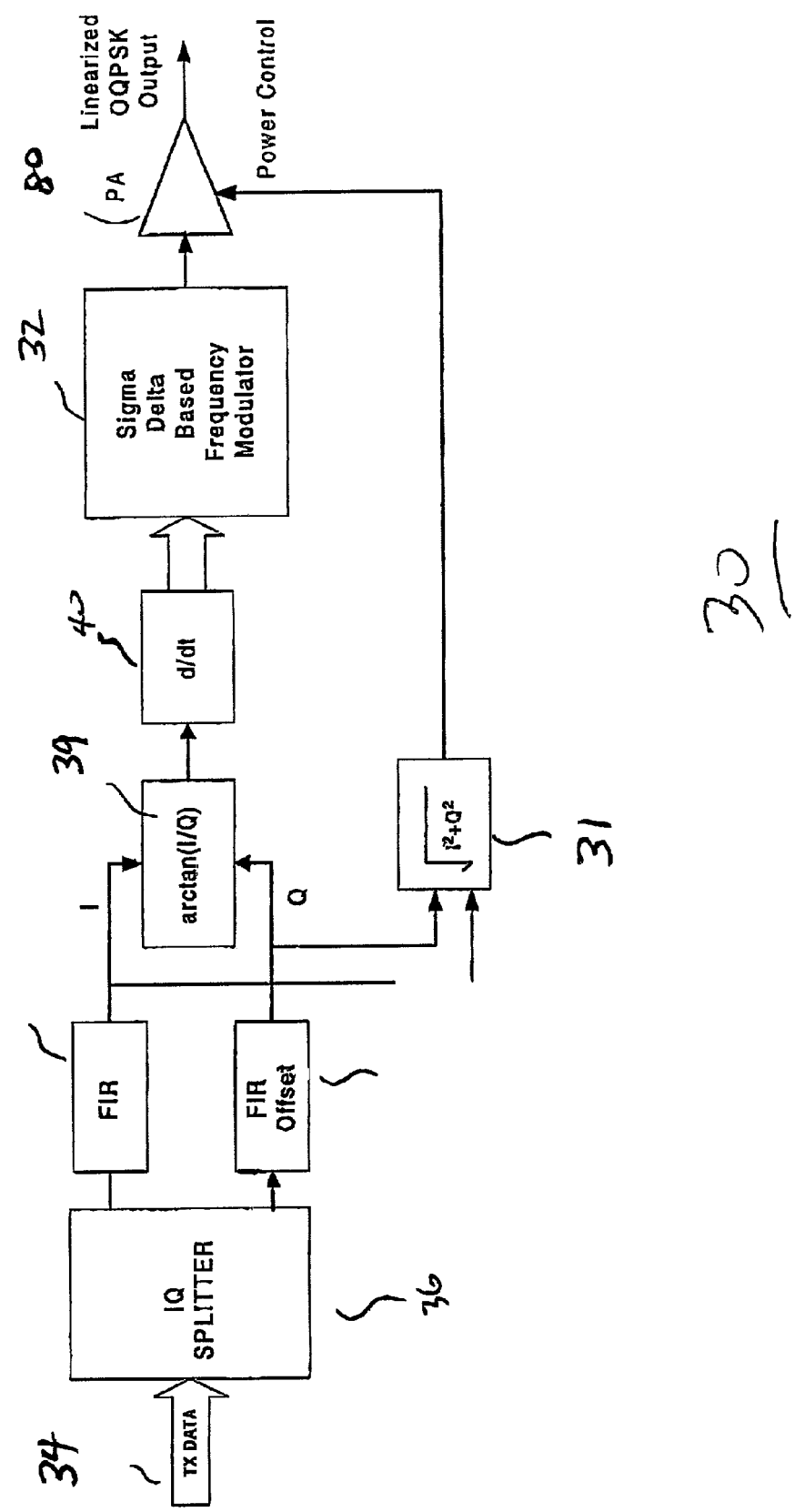
FIG. 2 is an exemplary embodiment of a vector modulator in accordance with the present invention.

FIG. 2 illustrates a first exemplary embodiment of the linearized OQPSK modulator 30 of the present invention. Referring to FIG. 2, the modulator 30 comprises an input port 34 for receiving serial data to be transmitted. In the current embodiment, the serial data is coupled to a demultiplexing circuit or splitter 36 (DEMUX) which operates to generate I and Q data corresponding to the input data. The I and Q outputs of the DEMUX circuit 36 are coupled to respective FIR filters 37, 38. It is noted that both the FIR filters 37, 38 operate at the Nyquist frequency. In addition, the FIR filter 38 receiving the Q data as an input signal also functions to offset the Q data such that the I and Q data are effectively "offset" from one another. The I data and the offset Q data are then coupled to a first lookup table 39, which is operative for performing an arctan function, namely the arctan of (Q/I). The lookup table 39 may, for example, comprise a read only memory (ROM) device. The output of the lookup table 39 is a digital number corresponding to the phase a carrier signal would be if the carrier signal was actually offset QPSK modulated in accordance with the serial data input to the offset QPSK signal modulator 31. The output of the arctan lookup table 39 is then coupled to a differentiator 40, which functions to differentiate the phase value of the signal output by the arctan lookup table 39 so as to obtain the corresponding frequency value of the signal. As such, the output of the differentiator 40 is a frequency value that is proportional to the frequency value of the carrier signal if the carrier signal was actually offset QPSK modulated in accordance with the serial data. In other words, the output of the differentiator 40 is a frequency value that represents the modulation data.

The modulator 30 also comprises a second lookup table 31, which receives the I data and the offset Q data output by the FIR filters 37, 38 as an input signal. The second lookup table 31 is operative for performing a function which determines the amplitude value of the input data signal (i.e., square root of $I^2+Q^2$). Similar to the first lookup table 39, lookup table 31 can, for example, comprise a read only memory (ROM) device. The output of the second lookup table 31 is coupled to a power amplifier 80, and functions to amplitude modulate the output signal by varying the output level of the power amplifier 80 in accordance with the amplitude of the input data signal.

Continuing, the output of the differentiator 40 is coupled to a sigma-delta based frequency modulator 32. As explained in more detail below, the sigma-delta modulator 32 functions to generate an output signal having a frequency which varies in accordance with changes in the frequency signal output by the differentiator 40. The output of the differentiator 40 is coupled to the input of the sigma-delta based frequency modulator 32. In other words, the output of the sigma-delta modulator 32 is a frequency modulated signal at the desired carrier frequency. It is noted that sigma-delta based frequency modulators/synthesizers are well known in the art. A discussion regarding sigma-delta modulators can be found in U.S. Pat. No. 4,800,342, which is incorporated herein by reference.

The output of the sigma-based frequency modulator 32 is coupled to the input of the power amplifier 80. The power amplifier 80 functions to amplify the frequency modulated carrier signal generated by the sigma-delta based frequency modulator 32. Importantly, however, as stated above, the level/amount of amplification is controlled by the output of the second lookup table 31 such that the output signal is amplitude modulated in accordance with the amplitude level of the input data signal. Thus, in accordance with the present invention, amplitude information concerning the input signal is removed prior to the generation of the frequency modulated carrier signal (which output by the sigma delta based frequency modulator) such that the components of the sigma delta modulator can operate in a "saturated" mode (i.e., constant amplitude). Amplitude information is then "put back" onto the frequency modulated carrier signal just prior to transmission of the signal by the power amplifier 80. As a result of adding the amplitude information to the frequency modulated signal, the modulator 30 of the present invention is able to achieve linearized OQPSK modulation, which allows for a reduction in the necessary bandwidth of the transmitted signal. Moreover, the combination of operating substantially all of the components of the modulator 30 in the "saturated" mode and being able to generate a linearized OQPSK modulated signal provides for a substantial cost savings.

Figure 3:
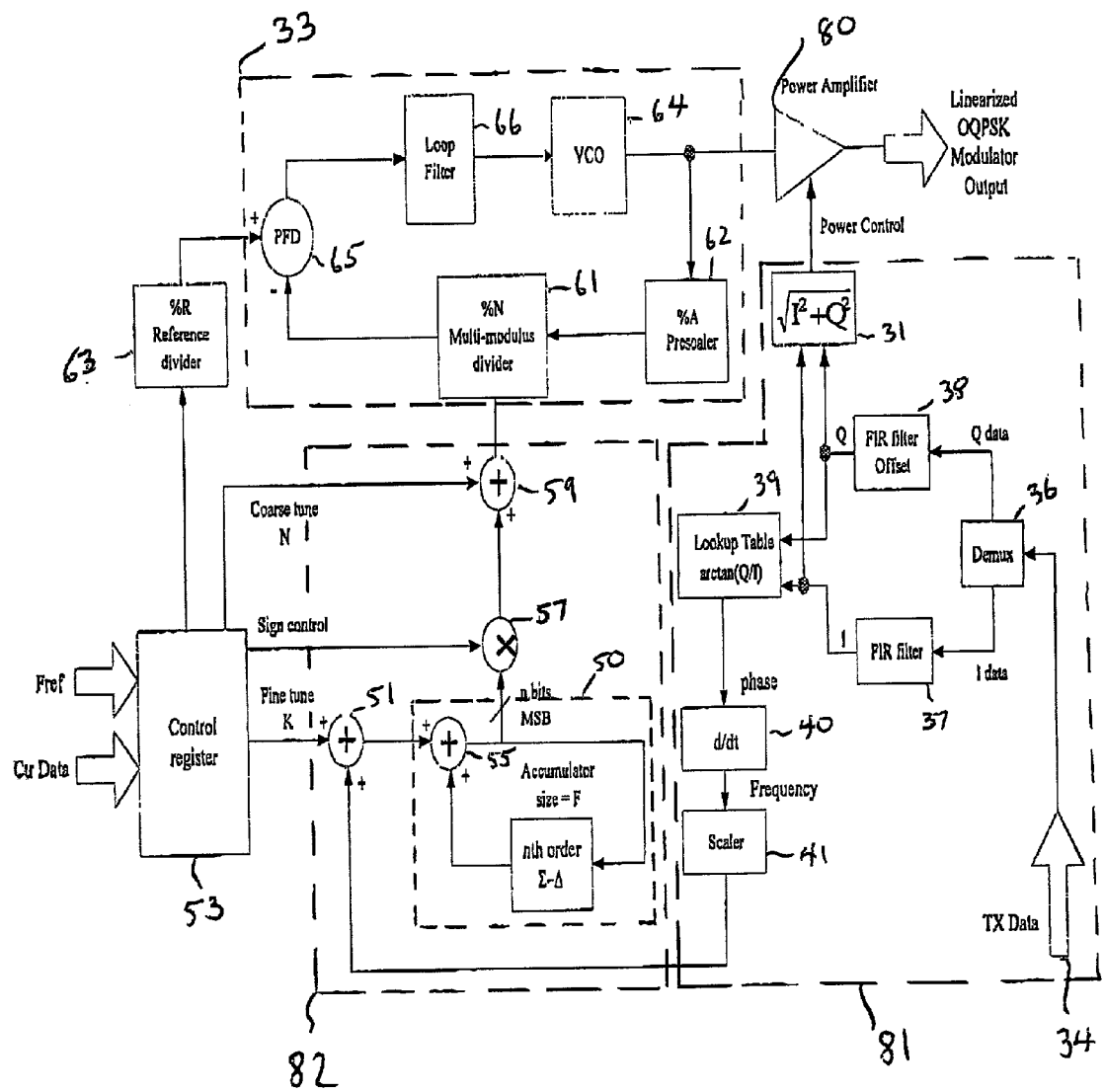
FIG. 3 is a more detailed diagram of the vector modulator illustrated in FIG. 2.

FIG. 3 is a more detailed block diagram of the modulator 30 illustrated in FIG. 2. Referring to FIG. 3, the modulator 30 comprises essentially three sections, namely, a offset QPSK signal modulator 81, a frequency modulator 82 and a phase-lock loop 33 associated with the generation of the carrier signal. The frequency modulator 82 and the phase-lock loop 33 form the sigma delta based frequency modulator 32 depicted in FIG. 2. The components and operation of each section, as well as the operation of the entire device is now described.

As indicated above, the offset QPSK signal modulator 81 functions to generate a signal having a frequency value that represents the modulation data to be imposed upon the carrier signal to be transmitted. More specifically, referring to FIG. 3, the offset QPSK signal modulator 81 comprises an input port 34 for receiving serial data to be transmitted. It is noted that the serial data can be coupled to a differential encoded such that the serial data is differentially encoded prior to being modulated. It is further noted that the output of the vector modulator 81 coupled to the sigma delta based frequency modulator 32 does not contain any amplitude information. Accordingly, as stated above, the components of the sigma based frequency modulator can advantageously operate in a "saturated" mode. Moreover, while the specific embodiment of the present invention is directed to OQPSK modulation, it is clear that the vector modulator 81 can implement addition types of vector modulation, and is not limited to OQPSK modulation.

Continuing with the current embodiment, the offset QPSK signal modulator 81 further comprises a demultiplexing or splitter circuit 36 (DEMUX) for generating I and Q data corresponding to the input data. The I and Q outputs of the DEMUX circuit 36 are coupled to the respective FIR filters 37, 38. The FIR filter 38 receiving the Q data as an input signal functions to offset the Q data such that the I and Q data are effectively offset from one another. The I data and the offset Q data are then coupled to the first lookup table 39, which is operative for performing an arctan function, namely the arctan of (Q/I). The I and Q data are also coupled to the second lookup table 31, which is operative for generating a signal representing the amplitude of the I and Q data signals. The output of the arctan lookup table 39 is then coupled to the differentiator 40, which functions to differentiate the phase value of the signal output by the arctan lookup table 39 so as to obtain the corresponding frequency value of the signal. The output of the differentiator 40 is then coupled to a FIR filter/scalar 41 that functions to pre-distort the output of the differentiator 40 so as to compensate for the effects of the synthesizer, and scale the value of the output of the differentiator 40 such that it is compatible with the sigma delta based frequency modulator 32. It is noted that in the current embodiment, all of the components of the offset QPSK signal modulator 81 are digital components in that they receive and process digital data in the form of digital words. In the event the data to be transmitted was originally presented in analog form, the present embodiment could be modified to include an analog-to-digital converter to disposed before the differential encoder.

Thus, the output of the offset QPSK signal modulator 81 is a digital data modulation signal representing the modulation that needs to be imposed on the carrier signal such that the resulting modulated carrier signal represents the serial input data offset QPSK modulated.

Continuing, the output of the offset QPSK signal modulator 81 is coupled to the frequency modulator 82. Referring to FIG. 3, the output of the FIR filter/scalar 41 is coupled to one input of an adder 51. The other input to the adder 51 receives a tuning signal, K, generated by a controller 53. As explained in more detail below, the tuning signal K functions to fine tune the output generated by the PLL 33 to the desired carrier frequency. In operation, the fine tune signal K is predetermined and set to the desired value. In addition, the output signal of the OQPSK signal modulator 81, which represents the modulation data, causes the frequency modulator 82 to continually adjust the output frequency of the PLL 33 such that the output signal generated by the PLL 33 is frequency modulated in accordance with the output signal of the OQPSK modulator 81.

More specifically, the sigma-delta modulator 32, which includes a sigma delta interpolator 50, functions to generate a pattern of control signals, which function to control the division factor (i.e., either N or N+1) of a variable divider circuit 61 contained in the phase-lock loop section 33. Specifically, the output of the sigma-delta modulator 50 is a pattern of N/N+1 control signals, also known as the mark/space ratio, which represents the modulation signal output by the offset QPSK signal modulator 81. In one embodiment of the present invention, the sigma-delta modulator 32 utilizes an n-bit accumulator to generate the mark/space ratio (i.e., control) signal. The n-bit accumulator has one input for receiving the signal output by the adder 55, which operates as a phase-increment signal. The output of the accumulator is an n-bit word, wherein the m most significant bits represent the mark/space ratio signal, and the n-m remaining bits constitute a phase error signal. Thus, the n-bit word output by the accumulator of the sigma-delta modulator 50 represents the instantaneous frequency of the signal to be generated and transmitted by the system.

Referring again to FIG. 3, the output of the sigma-delta interpolator 50, which represents the instantaneous frequency of the signal to be generated, is coupled to one input of an adder 57. The other input to adder 57 represents a sign control, which is generated by the controller 53. As is generally known, the sign control signal operates to avoid "roll over" when operating near an edge with respect to available operating frequencies. The output of adder 57 is coupled to one input of adder 59. The other input to adder 59 represents the coarse tuning signal N generated by the controller 53, which represents the frequency of the desired carrier signal. Similar to the fine tuning signal K, the course tuning signal is also variable and programmable. The output of adder 59, which represents the frequency of the desired carrier signal offset QPSK modulated in accordance with the serial input signal, is coupled to the variable divider circuit 61 of the phase-lock loop section 33, and functions to control the division factor of either N or N+1 performed by the variable divider circuit 61, thereby effectively frequency modulating the output signal generated by the VCO 64 in accordance with the mark/space ratio generated by the sigma-delta modulator 50.

Figure 1:
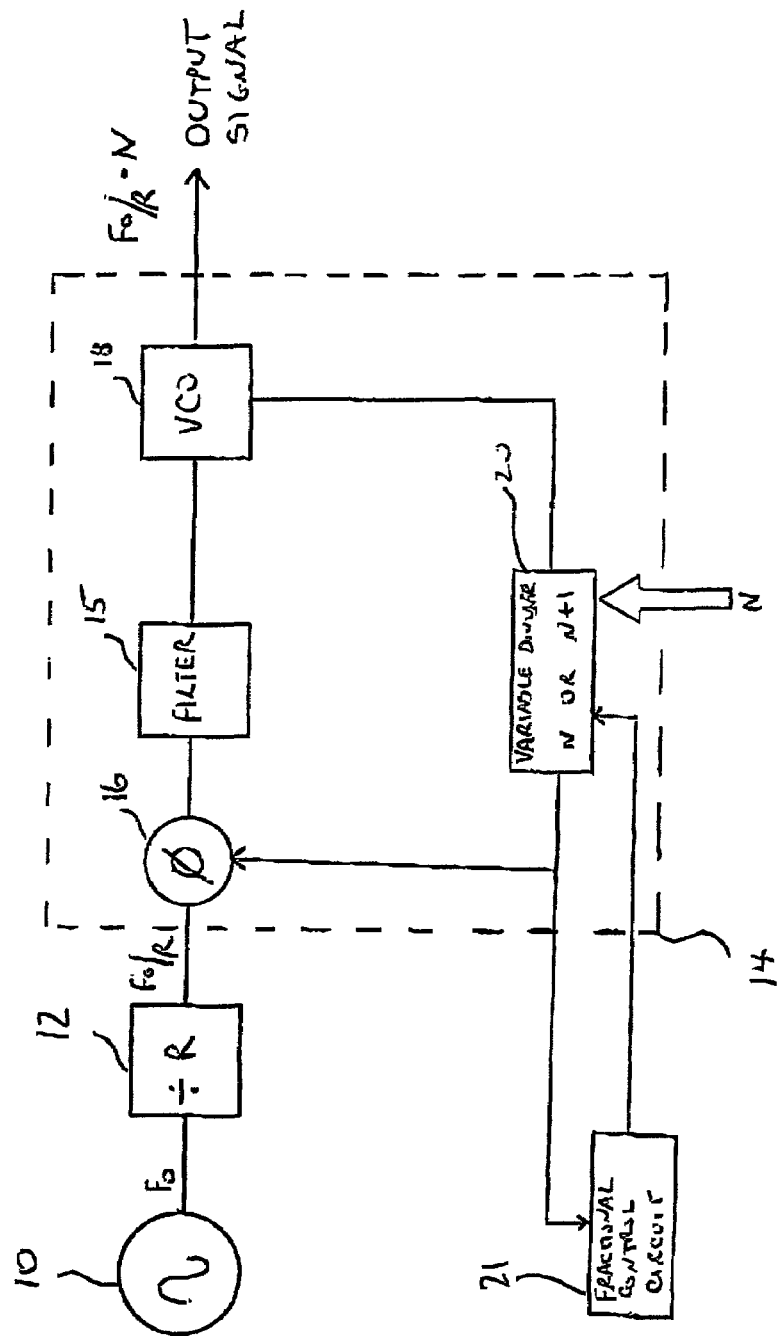
FIG. 1 is a block diagram of a prior art fractional N type synthesizer.

The phase-lock loop section 33 of the circuit illustrated in FIG. 3, functions in essentially the same manner as the phase-lock loop circuit discussed above with reference to FIG. 1. Referring to FIG. 3, the phase-lock loop portion comprises a reference divider 63, which receives a reference frequency signal from the controller 53. The reference divider 63 functions to divide the reference frequency signal be some predetermined frequency value. The output of the reference divider 63 is coupled to one input of a phase detector 65. The other input of the phase detector 65 is coupled to the output of the variable divider circuit 61. The output of the phase detector 65 is coupled to a loop filter 66, which functions to filter the spurious components associated with fractional N synthesizers. The output of the loop filter 66 is coupled to the input of the VCO 64. The output of the VCO 64, which represents the modulated output signal, is also coupled to a prescalar circuit 62. The output of the prescalar 62 is coupled to the input of the variable divider circuit 61, and as stated, the output of the variable divider circuit 61 is coupled to one input of the phase detector 65, thereby completing the phase-lock loop. The operation of the phase-lock loop is the same as that of the phase-lock loop associated with the circuit disclosed in FIG. 1.

The output of the PPL circuit 33 is coupled to the power amplifier 80. As stated above, the power amplifier 80 functions to amplify the frequency modulated carrier signal generated by the PLL circuit 33 in accordance with the amplitude levels of the input data signal as generated by the second lookup table 31. The output signal from the power amplifier 80 is then subsequently transmitted.

The linearized OQPSK modulator of the present invention provides important advantages over prior art devices. For example, by eliminating the direct digital synthesizer (DDS) from the design, the present invention eliminates the spurious/noise problems associated with the DDS device, while simultaneously reducing the cost of the synthesizer. In addition, by providing for the direct digital modulation of the carrier, the synthesizer of the present invention also eliminates the need for digital-to-analog converters, image rejection mixers and RF filters from the modulator section of the synthesizer design, thereby simplifying the design and providing a further cost savings.

In addition, the fractional N synthesizer of the present invention provides exceedingly high tuning/resolution capabilities at high frequencies, without any associated noise problems.

Furthermore, as amplitude information concerning the input signal is removed prior to the generation of the frequency modulated carrier signal such that the components of the sigma delta modulator can operate in a "saturated" mode, and amplitude information is then "put back" onto the frequency modulated carrier signal just prior to transmission of the signal by the power amplifier 80, the present invention is able to achieve linearized OQPSK modulation in an efficient, cost effective manner.

It is noted that while the direct digital modulator of the present invention has been described in conjunction with OQPSK, it is possible to utilize the foregoing modulator to implement other types of modulation in the CPSK family.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. A modulator comprising:
    an offset QPSK modulator, said offset QPSK modulator operative for receiving input data and generating a first output signal representing the modulation to be imposed on a carrier signal to effect offset QPSK modulation of said input signal and a second output signal representing an amplitude of said input data;
    a frequency modulator comprising a sigma-delta modulator, said frequency modulator operative for receiving said first output signal generated by said offset QPSK modulator, and generating a control signal representing the desired frequency of said carrier signal such that said carrier signal represents said input signal offset QPSK modulated;
    a phase-lock loop circuit comprising a voltage controlled oscillator for generating said carrier signal and a programmable frequency divider, said programmable frequency divider receiving said control signal as an input signal, said programmable frequency divider operative for changing the frequency of the carrier signal in accordance with said control signal, and
    an amplifier having variable gain for receiving and amplifying said carrier signal output by said phase-lock loop circuit, said second output signal controlling the amount of gain of said amplifier; and
    wherein said offset QPSK modulator comprises:
        a demultiplexer for receiving said input data and generating I and Q quadrature signals corresponding to said input data;
        a delay circuit operative for receiving said Q quadrature signal from said demultiplexer and for delaying the Q quadrature signal relative to the I quadrature signal;
        a digital waveform generator operative for receiving said I quadrature signal output by said demultiplexer and said delayed Q quadrature signal output by said delay circuit, and for generating a digital signal indicating the modulation to be imposed on said carrier signal.

2. A modulator according to claim 1, wherein said offset QPSK modulator further comprises:
    a first finite impulse response filter coupled to the output of said demultiplexer, said first finite impulse response filter receiving the I quadrature signal; and
    said delay circuit comprises a second finite impulse response filter coupled to the demultiplexer, and receiving the Q quadrature signal.

3. A modulator according to claim 1, wherein said digital waveform generator comprises:
    a first lookup table circuit operative for performing an arctangent function, said first lookup table circuit comprising a read-only-memory device, said first lookup table circuit generating a digital output signal indicating the phase of a modulation signal to be imposed on said carrier signal; and
    a differentiator coupled to said first lookup table circuit and operative for generating a digital output signal indicating the frequency of said modulation signal to be imposed on said carrier signal.

4. A modulator according to claim 1, wherein said phase-lock loop circuit further comprises:
    a reference divider operative for reducing the frequency of a reference signal by a predetermined factor;
    a phase detector coupled to said reference divider and said programmable frequency divider, said phase detector operative for generating an error signal indicating the frequency difference between a signal output by said reference divider and a signal output by said programmable frequency divider; and
    a filter coupled to the output of said phase detector.

5. The modulator according to claim 1, wherein said control signal is programmable so as to allow said voltage controlled oscillator to be controlled to a desired carrier frequency.

6. The modulator according to claim 1, further comprising a second lookup table for receiving said I quadrature signal and said delayed Q quadrature signal as input signals, and generating the second output signal indicating an amplitude of said received I quadrature signal and said delayed Q quadrature signal.

7. The modulator according to claim 1, wherein said carrier signal output by said phase-lock loop circuit has a constant envelope amplitude.

8. The modulator according to claim 1, wherein said amplifier operates to amplitude modulate said carrier signal output by said phase-lock loop in accordance with the value of said second output signal.

9. The modulator according to claim 8, wherein said amplifier outputs a linearized offset QPSK modulated signal.

10. A modulator utilizing direct digital offset QPSK modulation, said synthesizer comprising:
- a digital offset QPSK modulator, said digital offset QPSK modulator operative for receiving a digital input data and generating a first digital output signal, said digital output signal representing the modulation to be imposed on a carrier signal to effect offset QPSK modulation of said digital input signal and a second digital output signal representing an amplitude of said digital input data;
- a frequency modulator comprising a sigma-delta modulator, said frequency modulator operative for receiving said first digital output signal generated by said digital offset QPSK modulator, and generating a digital control signal representing the desired frequency of said carrier signal such that said carrier signal represents said input signal offset QPSK modulated;
- a phase-lock loop circuit comprising a voltage controlled oscillator for generating said carrier signal and a programmable frequency divider, said programmable frequency divider receiving said digital control signal as an input signal, said programmable frequency divider operative for changing the frequency of the carrier signal in accordance with said control signal; and
- an amplifier having a variable gain for receiving and amplifying said carrier signal output by said phase-lock loop circuit, said second digital output signal controlling the amount of gain of said amplifier; and
- wherein said digital offset QPSK modulator comprises:
  - a digital demultiplexer for receiving said input data and generating I and Q quadrature signals corresponding to said input data;
  - a digital delay circuit operative for receiving said Q quadrature signal from said demultiplexer and for delaying the Q quadrature signal relative to the I quadrature signal; and
  - a digital waveform generator operative for receiving said I quadrature signal output by said digital demultiplexer and said delayed Q quadrature signal output by said digital delay circuit, and for generating a digital signal indicating the modulation to be imposed on said carrier signal.

11. A modulator according to claim 10, wherein said digital waveform generator comprises:
- a first lookup table circuit operative for performing an arctangent function, said first lookup table circuit comprising a read-only-memory device, said first lookup table circuit generating a digital output signal indicating the phase of a modulation signal to be imposed on said carrier signal; and
- a digital differentiator coupled to said first lookup table circuit and operative for generating a digital output signal indicating the frequency of said modulation signal to be imposed on said carrier signal.

12. The modulator according to claim 10, further comprising a second lookup table for receiving said I quadrature signal and said delayed Q quadrature signal as input signals, and generating the second output signal indicating an amplitude of said received I quadrature signal and said delayed Q quadrature signal.

13. The modulator according to claim 10, wherein said carrier signal output by said phase-lock loop circuit has a constant envelope amplitude.

14. The modulator according to claim 10, wherein said amplifier operates to amplitude modulate said carrier signal output by said phase-lock loop in accordance with the value of said second output signal.

15. A method for generating an offset QPSK modulated signal at a desired carrier frequency, said method comprising the steps of:
- receiving a input data signal to be modulated;
- generating a digital output signal representing the modulation to be imposed on said carrier signal to effect offset QPSK modulation of said input data signal;
- generating an amplitude signal indicative of the amplitude of said input data signal;
- utilizing a frequency modulator comprising a sigma-delta modulator to receive said digital output signal and to generate a digital control signal representing the desired frequency of said carrier signal such that said carrier signal represents said input signal offset QPSK modulated;
- controlling a programmable frequency divider forming a portion of a phase-lock loop circuit, said programmable frequency divider receiving said digital control signal as an input signal, said programmable frequency divider operative for changing the frequency of said carrier signal in accordance with said control signal, said carrier signal being generated by a voltage controlled oscillator;
- amplifying said carrier signal in accordance with the level of said amplitude signal; and
- demultiplexing said input data signal and generating digital I and Q quadrature signals corresponding to said input data signal;
- delaying the Q quadrature signal relative to the I quadrature signal;
- performing an arctangent function on said delayed Q quadrature signal and said I quadrature signal so as to generate an output signal indicating the phase of a modulation signal to be imposed on said carrier signal; and
- differentiating said output signal so as to generate a digital signal indicating the frequency of said modulation signal to be imposed on said carrier signal.

16. A method for generating an offset QPSK modulated signal at a desired carrier frequency according to claim 15, wherein said digital control signal is programmable so as to allow said voltage controlled oscillator to be controlled to a desired carrier frequency.

17. A method for generating an offset QPSK modulated signal at a desired carrier frequency according to claim 15, wherein said carrier signal output by said phase-lock loop circuit has a constant envelope amplitude.

18. A method for generating an offset QPSK modulated signal at a desired carrier frequency according to claim 15, wherein said carrier signal output by said phase-lock loop is amplitude modulated in accordance with the value of said amplitude signal.

19. A method for generating an offset QPSK modulated signal at a desired carrier frequency according to claim 18, wherein said amplitude modulated carrier signal is linearized offset QPSK modulated signal.

* * * * *